(12) United States Patent
Rapoport et al.

(10) Patent No.: US 6,204,732 B1
(45) Date of Patent: Mar. 20, 2001

(54) APPARATUS FOR CLOCK SIGNAL DISTRIBUTION, WITH TRANSPARENT SWITCHING CAPABILITY BETWEEN TWO CLOCK DISTRIBUTION UNITS

(75) Inventors: Anatoli Rapoport, Rehovot (IL); Emanuel Nachum, Clearwater, FL (US)

(73) Assignee: ECI Telecom Ltd, Petah Tikva (IL)

( * ) Notice: Subject to any disclaimer, the term of this patent is extended or adjusted under 35 U.S.C. 154(b) by 0 days.

(21) Appl. No.: 09/247,173

(22) Filed: Feb. 9, 1999

(51) Int. Cl.$^7$ ........................................ H03L 7/00
(52) U.S. Cl. ................ 331/2; 370/503; 331/49; 327/141; 327/144; 375/376
(58) Field of Search ................... 327/144, 292, 327/296, 294, 295, 141, 147; 331/49, 2; 375/376; 370/503

(56) References Cited

U.S. PATENT DOCUMENTS

| | | |
|---|---|---|
| 4,282,493 | 8/1981 | Moreau . |
| 4,672,299 | 6/1987 | Grimes et al. . |
| 5,355,090 | * 10/1994 | Pajowski et al. . |
| 5,422,915 | 6/1995 | Byers et al. . |

\* cited by examiner

*Primary Examiner*—Arnold Kinkead
(74) *Attorney, Agent, or Firm*—Lilling & Lilling P.C.

(57) ABSTRACT

Apparatus for clock signals distribution with continuous switching capability between the outputs of a Clock Distribution Unit (CDU) and of a redundant CDU. Switching is transparent to load circuits which utilize these clock signals, by continuously keeping the output clock signals in the CDU and the redundant CDU frequency and phase coherent, by generating each output clock signal from a reference signal, using an adaptive PLL circuitry at each CDU, and preadjusting the phase of each output clock signal of the redundant CDU to the corresponding output clock signal of the CDU. In the event of a failure in the CDU, the output is taken from the redundant CDU immediately after failure detection. The phase of the reference frequency output clock signal of the standby CDU module is adjusted to the phase of the active CDU module by adding or subtracting an input signal to the phase error signal, which is generated in a PLL circuitry of the redundant CDU module. An adjustable delay line is used at each CDU to delay the clock signal that is provided from the active into the redundant CDU. The delay time is adjusted to obtain phase coherence between the high frequency outputs of the two CDUs and a fine adjustment on the reference frequency output clock signal. The redundant CDU module becomes active and connected to the load, whenever a failure is detected in the active CDU module.

29 Claims, 2 Drawing Sheets

APPARATUS FOR CLOCK SIGNAL DISTRIBUTION, WITH TRANSPARENT SWITCHING CAPABILITY BETWEEN TWO CLOCK DISTRIBUTION UNITS

FIELD OF THE INVENTION

The present invention relates to the field of communications. More particularly, the invention relates to a method and apparatus for clock signal distribution, with transparent switching between a Clock Distribution Unit (CDU) and a redundant CDU, thereby providing a redundant uninterrupted output clock signal.

BACKGROUND OF THE INVENTION

Several communications systems employ synchronous operations, for which incoming and outgoing data flows, as well as data processing, are controlled by a timing clock. Multiplexing techniques, such as Time Division Multiplexing (TDM), enable the combination of several data channels onto a common channel by using prefixed time slots for each channel. Data reconstruction at the receiver should be synchronized to the multiplexing transmitter for reliable extraction of the desired information. Such synchronization strongly depends on a continuous and uninterrupted clock signal. The clock signal is usually originated at a stable and accurate oscillator, and is distributed to any required component by a plurality of CDUs. Therefore, a backup clock distribution circuit should be provided and held in standby mode, to function instead of the original circuit, whenever a failure is detected. Such failures may comprise a lost clock signal, reduction in its power level, frequency instabilities, changes of pulse width, etc.

A known method for providing a continuous clock signal to each desired point is to employ a pair of CDUs which consists of an active CDU and an additional redundant CDU. The output of each CDU is connected to a corresponding input of a selecting switch, which normally transfers the output of the active CDU to the output of the switch, connected to the desired circuitry or component which utilizes the clock signal. Whenever a failure is detected, the selecting switch selects the redundant CDU output and transfers it to its output. The switching operation between the two clock signals should be transparent to the circuitry (the load), fed by the clock signal. Therefore, the two clock signals should be continuously coherent, otherwise switching may cause phase discontinuities and undesired bit transitions. In addition, since the input (reference) signal should also be distributed to other circuits via auxiliary clock outputs, it is required to continuously keep the auxiliary clock signals of the active and redundant CDUs coherent, as well.

Phase-Locked-Loops (PLLs) are sometimes used after the selecting switch to smooth these transitions and to remove noise and instabilities from the clock signal. However, this solution is still problematic, since when using a single PLL and splitting the filtered clock signal, jitter and noise are accumulated along the clock signal path. This requires using such PLL circuitry in each input of a circuitry or component which utilizes the clock signal, and is therefore, costly. Moreover, even when using such plurality of PLLs, each of which smoothes incoming transients, during a long term, a phase difference will be developed, and perfect coincidence will not be obtained.

U.S. Pat. No. 4,282,493 discloses a clock signal generator for providing redundant clock signals, which comprises a master clock module and a slave clock module. The master and slave clock modules are always phase and frequency locked to one another. Upon detecting malfunction, the master is switched automatically or externally, between the clock modules. However, this construction is cumbersome, since each module comprises two PLL oscillators. In addition, this construction lacks the capability of separately controlling the response time of the locking circuitry, which causes smoother transition, and is not designed for the distribution of an externally fed clock signal, or of a higher frequency clock signal, based on a low frequency input signal.

U.S. Pat. No. 4,672,299 discloses a clock circuit which employs PLL circuits to synchronize between two input signals. During normal operation mode, the clock circuit is locked to one input signal. When switching to the other input signal, the PLL divider is controlled to force the loop phase to be matched to the phase of the newly selected input signal. However, this clock is not continuously synchronized to an input signal, but rather provides a phase correction in response to a phase error.

U.S. Pat. No. 5,422,915 discloses a fault tolerant CDU for providing synchronized clock signals to multiple circuit loads, which comprises oscillator circuitry, synchronization circuitry, selection circuitry and distribution circuitry, arranged in redundant form, so that partial failure will not result in total distribution failure. However, this CDU is complex and comprises a plurality of redundant sub-circuit. In addition, all redundant clock signals are locked to a reference signal, with no adaptation capability to be locked to each other.

U.S. Pat. No. 5,355,090 discloses a redundant clock system, generating active and standby clock signals in phase with one another through a pair of substantially identical cross-connected phase corrector circuits. Timing errors are reduced by causing all clock bus interface circuits to activate a standby corrector circuit and to cause the previously active standby corrector circuit to operate in standby mode. This system, however, requires two bus interface circuits and lacks adaptive operation of its employed PLLs to different requirements of response time.

All the methods described above have not yet provided satisfactory solutions to the problem of transparent switching between a Clock Distribution Unit (CDU) and a redundant CDU, while providing a redundant uninterrupted clock signal.

It is an object of the present invention to provide a method and apparatus for clock signal distribution with transparent switching between a Clock Distribution Unit (CDU) and a redundant CDU, which overcomes the drawbacks of prior art.

It is another object of the present invention to provide a method and apparatus for clock signal distribution, with transparent switching between a Clock Distribution Unit (CDU) and a redundant CDU, while keeping their corresponding clock signals continuously coherent.

It is still another object of the present invention to provide a method and apparatus for clock signal distribution with transparent switching between a Clock Distribution Unit (CDU) and a redundant CDU, with adaptive response time of their corresponding loop filters.

Other objects and advantages of the invention will become apparent as the description proceeds.

SUMMARY OF THE INVENTION

The invention is directed to a method for clock signals distribution with continuous switching capability between the outputs of a Clock Distribution Unit (CDU) and of a redundant CDU. This switching capability is transparent to load circuits which utilize these clock signals. The output clock signals of the CDU and the redundant CDU are continuously kept frequency and phase coherent by generating each output clock signal from a reference signal, using an adaptive PLL circuitry at each CDU, and pre-adjusting the phase of each output clock signal of the redundant CDU to the corresponding output clock signal of the CDU. In the event of a failure in the CDU, the output is taken from the redundant CDU immediately after failure detection.

The PLL in each CDU module can operate with slower or faster response time, in response to a corresponding control signal, and can shift the phase of the generated output clock signal according to a corresponding input signal. Each CDU module can operate in active or standby mode, in response to a corresponding control signal.

Switching capability is provided by a multiplexer, selecting between the output of the active CDU module and the output of the standby CDU module and connecting it to a load circuit, in response to a control signal from a control circuit. The phase of the improved reference frequency output of the clock signal of the standby CDU module is adjusted to the phase of the active CDU module by adding or subtracting an input signal to the phase error signal, which is generated in the PLL circuitry of the standby CDU module. An adjustable delay line is used at each CDU module to delay the clock signal that is provided from the active into the standby CDU. The delay time is adjusted to obtain phase coherence between the high frequency outputs of the two modules. The standby CDU module becomes active and connected to the output of the multiplexer whenever a failure is detected in the active CDU module.

The invention is also directed to a clock signal distribution apparatus for generating a clock signal and a redundant clock signal, which is phase and frequency coherent to said first clock signals. The apparatus comprises:

a) a pair of first and second CDU modules, each CDU module being capable of operating in active or standby mode, in response to a corresponding control signal, the output clock signal of the active CDU module is locked to a reference input signal, the output clock signal of the standby CDU module is locked and phase coherent to the output clock signal of the active CDU module;

b) a selection circuitry with an input connected to the output of the first CDU module and with another input connected to the output of said second CDU module, the selection circuitry can select one of the inputs and transfer it to its output, in response to a corresponding control signal; and d) a control circuit, connected to the first and second CDU modules and to the selection circuitry, for determining and/or switching the operation mode of each CDU module and for connecting the output of the redundant CDU module to the output of the apparatus, whenever a failure is detected in the active CDU module.

Preferably, each CDU module comprises:

a) an input selecting switch, with two inputs, an output and a control input, for selecting between two frequency inputs;

b) a PLL circuit connected to the output of the switch, for generating a higher frequency output clock signal, delivered to a load, and an improved reference frequency, delivered to the other CDU module and to an auxiliary output, from one of the two frequency inputs;

c) a monitoring circuitry, coupled to at least the output of the PLL circuit, for monitoring the operation of said PLL circuit and providing a corresponding alarm signal whenever a failure is detected;

d) an arbitration circuit connected to said monitoring circuitry, for determining the operation mode of said CDU module by providing the control circuit a control signal to switch the operation mode whenever a failure is detected; and e) an analogue adjustable delay line, connected to the improved reference frequency output of the PLL circuit for compensating the phase of the higher frequency output clock signal of the other CDU module.

Preferably, each PLL circuit comprises:

a) a VCO for generating a higher frequency output clock signal from an input frequency;

b) a frequency divider for providing a feedback signal from the VCO output to the inverting input of the phase detector;

c) a phase detector for providing a phase error signal for locking said auxiliary output clock signal of the VCO to the reference signal;

d) a reference frequency input, connected to the non-inverting input of the phase detector, for providing the input reference clock signal to the PLL circuit;

e) an active LPF with slower and faster response selection modes, for filtering noise and providing a frequency correction signal to the VCO;

f) a digital to analogue converter, connecting between the output of said LPF and the tuning input of the VCO, for converting digital correction words to an analogue tune voltage for the VCO; and g) an adder with an output connected to the input of the active LPF, a non-inverting input connected to output of the phase detector, and an inverting input for receiving signals and compensating the phase of the improved reference frequency clock signal of the CDU module.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
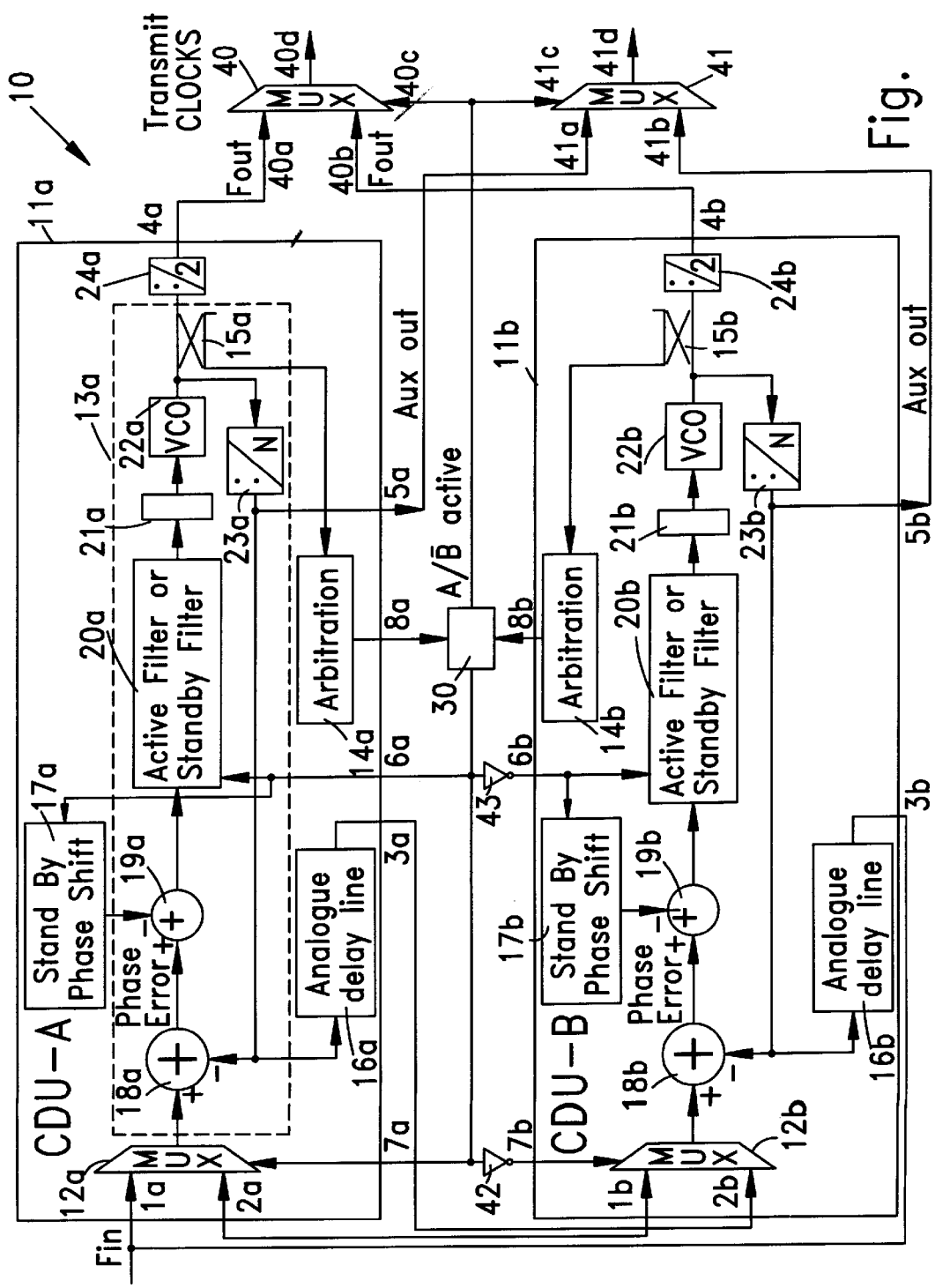
FIG. 1 is a block diagram of an apparatus for clock signal distribution, with transparent switching between a Clock Distribution Unit (CDU) and a redundant CDU, according to a preferred embodiment of the invention.

FIG. 1 is a block diagram of an apparatus for clock signal distribution, with transparent switching between a Clock Distribution Unit (CDU) and a redundant CDU, according to a preferred embodiment of the invention. The apparatus 10 consists of two essentially identical CDU modules, 11a and 11b. CDU module 11a comprises two frequency inputs, 1a and 2a, three frequency outputs, 3a, 4a and 5a, two control inputs 6a and 7a and one control output 8a. CDU module 11b comprises two frequency inputs, 1b and 2b, three frequency outputs, 3b, 4b and 5b, two control inputs 6b and 7b and one control output 8b. The two frequency outputs 4a and 4b of each module provide frequencies of $F_{out}$, which are generated from VCO 22a and 22b by dividers (typically divide by 2 dividers) 24a and 24b in modules 11a and 11b, respectively. The frequencies $F_{out}$ are input into the inputs 40a and 40b, respectively, of a selecting switch 40, which selects one of them according to a control signal provided to its control input 40c, and connects the selected input to its output 40d. The two auxiliary frequency outputs 5a and 5b of each module are input into the inputs 41a and 41b, respectively, of a selecting switch 41, which selects one of them according to the same control signal provided to its control input 41c, and connects the selected input to its output 41d. Inputs 6a, 6b, 7a, 7b, 40c and 41c are simultaneously controlled by a control circuitry 30, according to corresponding control signals 8a and 8b, arriving from CDU module 11a and/or 11b.

The input (reference) frequency $F_{in}$ is simultaneously fed into inputs 1a and 1b. The apparatus 10 continuously provides a main output frequency $F_{out}$ and an auxiliary output frequency $F_{aux}$ via outputs 40d and 41d, respectively. Normally, the main output frequency $F_{out}$ is an integer multiple of the input frequency $F_{in}$, and is used to feed the load circuit which utilizes the clock signal. The auxiliary output frequency $F_{aux}$ is essentially identical to the input frequency $F_{in}$, with improved (reduced) wander and jitter, and is used to transfer the (improved) input frequency $F_{in}$, to other CDU modules, as well as to other loads. $F_{out}$ and $F_{aux}$, are developed from the same circuitry, and, hence, have similar reduced wander and jitter properties. A straight forward distribution of $F_{in}$ is not practical because of degradation in the signal quality, due to accumulated wander and/or jitter along the signal propagation path. $F_{in}$ is usually derived from a high quality oscillator, such as an atomic clock. An exemplary value of $F_{in}$ may be 2 KHz.

Apparatus 10 is operated when one of the modules 11a or 11b operates in an active mode, in which the active module provides both main and auxiliary output frequencies $F_{out}$ and $F_{aux}$, respectively, while the other module operates in a standby mode, in which $F_{out}$ and $F_{aux}$ are generated and maintained in phase and frequency coherence with $F_{out}$ and $F_{aux}$, generated at the active module 11a. Therefore, a continuous phase and frequency coherence is maintained between the corresponding output frequencies of the two modules, and the standby module 11b is continuously fully redundant to the active module 11a. Upon detecting a failure in the active module, a resulting control signal simultaneously alternates the input selection of the selecting switches 40 and 41, thereby switching over to the standby module 11b and continuing to provide the desired clock signal to the load circuitry, with no interruptions, such as phase discontinuities.

For a better understanding of the operation of apparatus 10, it is assumed that firstly, module 11a (CDU-A) operates in an active mode, while module 11b (CDU-B) operates in a standby mode (since modules 11a and 11b are essentially identical, the operating mode of each module may be switched, if desired). The input (reference) frequency $F_{in}$ is fed into the input 1a of a selecting switch 12, which may be a dual input multiplexer (MUX). The control input 7a causes the switch 12a to select input 1a to be transferred to the output of the switch. The input frequency $F_{in}$ is fed into a digital PLL circuit 13a, which generates both the main and auxiliary output frequencies $F_{out}$ and $F_{aux}$ of the active module 11a, from the input frequency $F_{in}$. The PLL 13a consists of a digital phase detector 18a, the output of which is connected to the non-inverting input of a digital adder 19a. The adder 19a also comprises a second input, to enable the addition of a non-zero external value to the value at the first input, whenever desired, such as in standby mode. The output of the adder 19a is fed into an active digital Low-Pass Filter (LPF) 20a, which is responsible for the PLL's capability to eliminate wander and jitter at higher frequencies, and to provide a phase correction tune signal to a Voltage Controlled Oscillator (VCO) 22a. The VCO 22a may be, for instance, a Voltage Controlled Crystal Oscillator (VCXO), which is relatively stable and provides a high frequency output signal with low phase-noise, in one case, operating at 38.88 MHz. The output of the LPF 20a, which is a digital word, is fed into an Digital-to-Analog (D/A) converter 21a, to provide an analogue control voltage to the tuning input of the VCO 22a. When locked to $F_{in}$, the VCO 22a provides the desired basis for clock signal $F_{out}$, which is delivered via divider 24a to the output 4a of the active module 11a. The feedback path of the PLL circuit 13a is formed by feeding the VCO output into a divider 23a, and feeding the divided frequency of $F_{out}$ (i.e., $F_{out}$/N) into the second (inverting) input of the phase detector 18a, to form a closed negative feedback loop. The dividers 23a and 24a are tuned to provide an integer prefixed ratio between $F_{out}$ and $F_{in}$. For example, if the division ratio of the divider is N, the output frequency of the VCO 22a when viewed after the divider 24a, when locked to $F_{in}$, is given by:

$$F_{out}=N \cdot F_{in} \quad [\text{Eq. 1}]$$

In this embodiment, a conventional divide by N counter is used, with the divide by 2 output providing $F_{out}$, and the divide by 19,440 output providing the (2 KHz) $F_{aux}$ signal, which is also fed back into the phase detector 18a, for comparison to $F_{in}$. Since the formed feedback is negative, any deviation from the condition of Eq. 1 or any offset in the phase of $F_{aux}$ and $F_{in}$ results in a non-zero phase error signal at the output of the phase detector 18a. The error signal is filtered and shaped by the active LPF 20a, and a responsive digital correction signal is provided to the Digital-to-Analog (D/A) converter 21a which converts it to an analogue voltage, fed into the input of the VCO 22a. The correction signal forces the VCO 22a to change its frequency in a direction that reduces the phase error to zero. At this point, the VCO output is phase and frequency locked to the input frequency $F_{in}$ (although at a multiple frequency). The active LPF 20a comprises an input for selecting between two operation modes, the active mode and the standby mode. During the active mode, the active LPF 20a is set so that the PLL can pass any deviation in the incoming frequency that are less than a certain value. In this example, the cut-off frequency (−3 dB point) is set to ⅟30 Hz. Any deviation of the incoming frequency, which is slower than ⅟30 Hz, will be passed, and the frequency $F_{aux}$ will track it. If the deviation of the incoming frequency is faster than ⅟30 Hz (e.g., a jitter or wander of 0.1 Hz), it will be suppressed by the PLL with active LPF 20a.

During the standby mode, the active LPF 20a is set to track most deviations immediately to the output. In this example, the cut-off frequency (−3 dB point) is set to ⅓ Hz, which is higher by an order of magnitude from the cut-off frequency in the active mode. In this case, the active LPF 20a will track the incoming signal in most cases, except from locally generated noise which will be filtered out, and therefore will remain locked to the active module.

While locking is maintained in the active module 11a, the frequency $F_{aux}$ at the output of the frequency divider 23a is actually $F_{in}$, but with reduced noise and jitter, resulting from the PLL filtering properties. The improved signal is coupled and fed into the input 41a of the selecting switch 41, via the auxiliary output 5a.

Malfunctions, such as lost output, lost input, frequency instability and loss of lock and potentially others, are continuously monitored at points, such as 15a. All possible failure condition for each module are summed together in the arbitrator circuit 14a, so that any failure will cause a failure indication signal to reach the control circuitry 30. Table 1 is a truth table, implemented as the control decision signal, provided by the control circuitry 30.

TABLE 1

| module 11a (CDU-A) | module 11b (CDU-B) | control decision |
|---|---|---|
| O.K. | O.K. | maintain previous state |
| O.K. | not O.K. | module 11a active |
| not O.K. | O.K. | module 11b active |
| not O.K. | not O.K. | maintain previous state |

When the provided decision signal is in its high level, module A is in an active mode and module B is in a standby mode. When the decision signal is in its low level, inverters 42 and 43 place module B in an active mode and module A in a standby mode. In practice, the operations of Table 2 may be carried out with a simple combinatorial logic and a state device, such as a J-K flip-flop circuit. The output of the control circuitry 30 provides a signal directly to each of the inputs 6a, 7a, 40c and 41c, and via inverters 43 and 42 to inputs 6b and 7b of module 11b. As a result, inputs 1a, 40a and 41a are transferred to the outputs of the selecting switches 12a, 40 and 41, respectively. Input 6a provides a corresponding control signal to the digital LPF 20a, causing the filter to operate in its active (slower) mode, and to standby phase shift 17a, causing it to output a zero shift.

According to a preferred embodiment of the invention, during the active mode of module 11a, module 11b, which has the same structure of the active module 11a, is held in a standby mode. At this mode, the control circuitry 30 drives the selecting switch 12b to transfer the input 2b to its PLL and simultaneously provides a control signal via inverters 43 and 42, to each of the inputs 6b, 7b, and directly to 40c and 41c. As a result, inputs 1b, 40b and 41b are not transferred to the outputs of the selecting switches 12b, 40 and 41, respectively, and no clock signals, generated at the standby module, appear at the output of the apparatus 10. Input 6b provides a corresponding control signal to the digital LPF 20b, causing the filter to operate in its standby (faster) mode, to pass almost all changes in its input ($F_{aux}$ of the active module) to its output. Only high frequency noise will be filtered out. Input 6b also provides an input to standby phase shift 17b, as will be discussed.

The improved input frequency $F_{aux}$, from the active module 11a, is coupled via an analogue delay line 16a, contained in the active module 11a, and fed into the input 2b via the output 3a in the active module 11a. Hence, the standby module 11b is locked to $F_{aux}$ rather than directly to $F_{in}$. Practically, since the standby module 11b has the same structure of the active module 11a, the clock signal generation ($F_{out}$ and $F_{aux}$) in the standby module 11b is carried out in the same way of the active module 11a. The differences are determined by the arbitrator circuitry, which varies the operation mode of the digital active LPF in each module, the added phase shift, as well as the input signal source selection (external or from the other module).

The output frequencies $F_{out}$ and $F_{aux}$ of the standby module 11b are generated from $F_{aux}$ of the active module 11a, by a PLL circuit 13b, similar to the generation of $F_{out}$ and $F_{aux}$ in the active module 11a. Therefore, $F_{out}$ and $F_{aux}$ at both modules are frequency coherent. On the other hand, they are not phase coherent, because of propagation delays of the $F_{aux}$ signal from its origin to the input of the PLL circuit 13b.

Phase coherence for $F_{out}$ and $F_{aux}$ is provided between the two modules in stages, a digital or coarse stage, and an analogue or fine stage. The coarse or digital coherence is achieved by using a standby phase shift input 17b into the adder 19b. This will now be illustrated using a preferred digital PLL. Since the ratio between the low frequency $F_{aux}$ and the high frequency $F_{out}$ is N, each low frequency period comprises N high frequency periods. The digital PLL uses a digital phase detector 18b which consists of a counter, clocked by the feedback signal $F_{out}$, (not shown) whose output is fed into a latch, clocked by $F_{in}$. The counter is selected to roll over every N periods. In practice, this counter is a part of divider 23b, and hence, its output is in-phase with $F_{aux}$. Therefore, any phase difference between the low frequency clock signals of the two modules, may be expressed by a integer n (0<n<N), ranging between 1 and N−1, of equivalent high frequency periods, which represent the digital output of the phase detector. According to a preferred embodiment of the invention, this phase difference is compensated by introducing a digital number which is equivalent to n, into the (second) inverting input of the digital adder 19b, of the standby module 11b. As a result, the PLL circuit 13b of the standby module 11b, will shift the phase of the low frequency clock signal ($F_{aux}$) of the standby module by −n high frequency periods, and, hence, the two low frequency clock signals of the two modules will also become phase coherent. The reason for this phase shifting of the PLL circuit 13b is that at locking the PLL circuit 13b maintains a zero phase error signal at the input of the digital LPF 20b. Therefore, after introducing a correction number (n) in the inverting input, the digital phase detector 18b provides a phase error (−n) which is equal to the correction number, so as to be locked to the input frequency $F_{aux}$. For example, if the low frequency is 2 KHz, N=1000, and the digital number which may be introduced at the input of the digital adder 19b, is ranging between 0 and 999. If the phase shift between the low frequency clock signal of the standby module and the low frequency clock signal of the active module is equivalent to 100 high frequency periods, the number 100 should be introduced to the inverting input of the digital adder 19b to achieve phase coherence.

Shifting the phase of the low frequency clock signal in the standby module 11b also causes a similar phase shift (of −in high frequency periods) of the high frequency clock signal, but does not practically affect the phase coherence of the high frequency clock signal, since shifting the phase by an integer number of periods is transparent to phase coherence.

The fine tuning, done via an analogue circuitry, is necessary in order to continuously provide a redundant high frequency ($F_{out}$) clock signal, as well as to synchronize the $F_{aux}$ signals within the domain of less than one cycle of $F_{out}$.

The correction is carried out, according to a preferred embodiment of the invention, by supplying the low frequency input signal ($F_{aux}$=improved $F_{in}$) form output 3a in the active module 11a, into input 2b of the standby module 11b, via the analogue delay line 16a, in the active module 11a. Such analogue delay line may be a discrete component, available in the market, with a varying delay selection, or may be realized by an electrical conductor path with varied length.

Figure 2A:
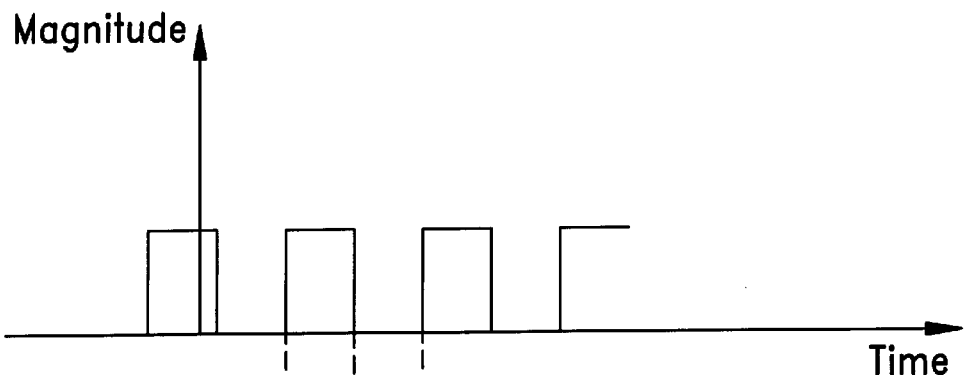
FIG. 2A schematically illustrates the high frequency clock signal at the output of the active CDU module, as a function of time.
Figure 2B:
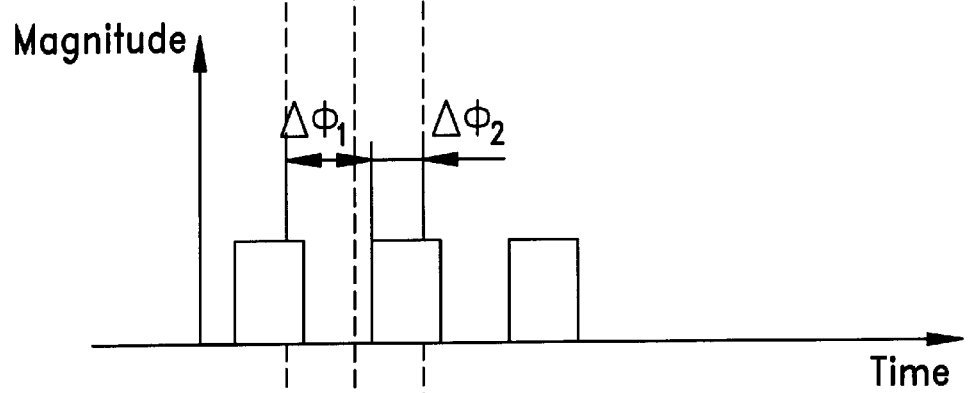
FIG. 2B schematically illustrates the high frequency clock signal at the output of the standby module, as a function of time, without phase correction.
Figure 2C:
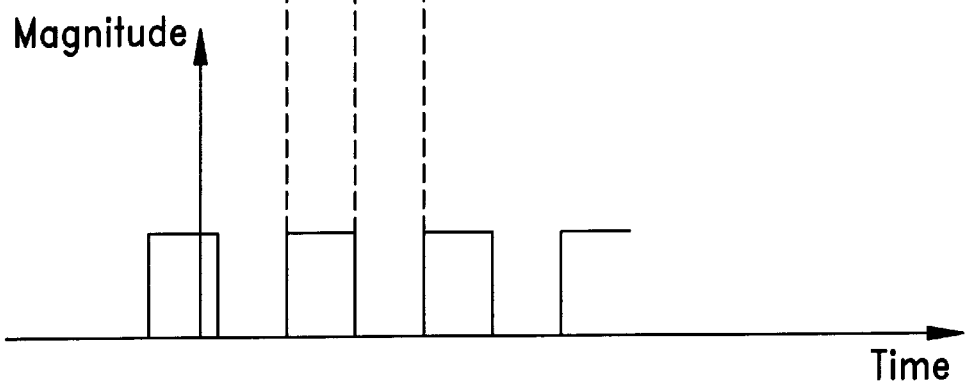
FIG. 2C schematically illustrates the high frequency clock signal at the output of the standby module, as a function of time, after phase correction of a delay line.

The phase correction using the delay line 16a is illustrated in FIGS. 2A, 2B and 2C. FIG. 2A schematically illustrates the high frequency clock signal at the output 4a of the active module 11a, as a function of time. FIG. 2B schematically illustrates the high frequency clock signal at the output 4b of the standby module 11b, as a function of time. Without using the delay line 16a, a phase difference of $\Delta\phi_1$ is obtained between the two clock signals. Therefore, in order to compensate this phase difference, the clock signal of the standby module 11b should be further delayed by the delay line 16a, so as to obtain additional phase shift of $\Delta\phi_2$, which is caused by the delay line 16a. $\Delta\phi_1+\Delta\phi_2$ are equivalent to a single period, i.e., to $1F_{out}$. If, for instance, $F_{out}$=2 MHz (i.e., one period is equivalent to 0.5 $\mu$Sec) and the delay $\Delta\phi_1$ is equivalent to 0.1 $\mu$Sec, the delay $\Delta\phi_2$ of the delay line 16a should be tuned to 0.4 $\mu$Sec. FIG. 2C schematically illustrates the high frequency clock signal at the output 4b of the standby module 11b, after phase correction of the delay line 16a, as a function of time. The phase difference $\Delta\phi_1$ has been compensated by $\Delta\phi_2$, and the resulting high frequency output of the standby module 11b is phase (and frequency) coherent with the high frequency output of the active module 11a. Hence, switching between the high frequency outputs of the active and stand by modules and the low frequency outputs of the active and the standby modules are transparent to a load circuit.

According to a preferred embodiment of the invention, continuous phase coherence between the active and the standby modules may be achieved also when using an analogue PLL instead of a digital PLL in each module. In this embodiment, the active LPF may be an analogue loop filter, realized by, for instance, an operational amplifier, and the summation circuitry in each module may be analogue. Instead of introducing a digital number, an analogue voltage may be introduced to achieve phase coherence.

The above examples and description have of course been provided only for the purpose of illustrations, and are not intended to limit the invention in any way. As will be appreciated by the skilled person, the invention can be carried out in a great variety of ways, employing more than one technique from those described above, all without exceeding the scope of the invention.

What is claimed is:

1. A clock signal distribution apparatus for generating at least a first clock signal and at least a second redundant clock signal, said second clock signal being phase and frequency coherent to said first clock signal, said apparatus comprising a pair of first and second CDU modules, each CDU module being capable to operate in active or standby mode, in response to a corresponding control signal, an output clock signal of the active CDU module being locked to a reference input signal, an output clock signal of the standby CDU module being locked and phase coherent to the output clock signal of the active CDU module, said active mode characterized by frequency filtering response being different from the response in the standby mode.

2. Apparatus according to claim 1, further comprising:
   a) at least one selection circuitry having at least two inputs and at least one output, one input of said selection circuitry being connected to an output of said first CDU module, another input of said selection circuitry being connected to an output of s aid second CDU module, said selection circuitry being capable to select one of said inputs and transfer said selected input to its output in response to a corresponding control signal; and
   b) a control circuit, said control circuit being connected to said first and said second CDU modules, and to said selection circuitry, for determining and/or switching the operation mode of each CDU module and for connecting the output of the redundant CDU module to the output of the apparatus, whenever a failure is detected in an active CDU module.

3. Apparatus according to claim 1, wherein each CDU module comprises:
   a) an input selecting switch, having at least two inputs, an output and a control input, for selecting between two frequency inputs;
   b) a PLL circuit being connected to the output of said switch, for generating at least one higher frequency output clock signal, delivered to a load, and at least one improved reference frequency, delivered to the other CDU module, from one of said two frequency inputs;
   c) a monitoring circuitry, coupled to the output of said PLL circuit, for monitoring the operation of said PLL circuit and providing a corresponding alarm signal whenever a failure is detected; and
   d) an arbitration circuit being connected to said monitoring circuitry, said arbitration circuit determining the operation mode of said CDU module by providing the control circuit a control signal to switch the operation mode whenever a failure is detected.

4. Apparatus according to claim 3, further comprising an analogue adjustable delay line, being connected to the improved reference frequency output of said PLL circuit for compensating the phase of the higher frequency output clock signal of the-other CDU module.

5. Apparatus according to claim 3, further comprising an input into the PLL circuit for compensating the phase of at least another output clock signal to obtain phase coherence between said at least another output clock signal in the redundant CDU module, and at least another output clock signal in the first CDU module, having the same frequency.

6. Apparatus according to claim 3, wherein each PLL circuit comprises:
   a) a VCO for generating higher frequency output clock signal from a reference frequency;
   b) a phase detector for providing a phase error signal for locking said higher frequency output clock signal of the VCO to the reference signal;
   c) a frequency divider for providing a feedback signal from the VCO output to an inverting input of said phase detector;
   d) a reference frequency input, connected to a non-inverting input of said phase detector, for providing the reference clock signal to the PLL circuit;
   e) an active LPF having slower and faster response selection modes, for filtering noise and providing a frequency correction signal to said VCO;
   f) a D/A converter, connecting between the output of said LPF and a tuning input of said VCO, for converting digital correction words to an analogue tune voltage for said VCO; and
   g) an adder, having an output being connected to the input of said active LPF, a non-inverting input being connected to output of said phase detector, and an inverting input for receiving signals and compensating the phase of the improved reference frequency clock signal of the CDU module.

7. Apparatus according to claim 3, wherein the PLL circuitry is a digital PLL.

8. Apparatus according to claim 3, wherein the VCO is a VCXO.

9. Apparatus according to claim 6, wherein the frequency divider is a digital divider.

10. A method for clock signals distribution having continuous switching capability between the outputs of a Clock Distribution Unit (CDU) and of a redundant CDU, said switching capability being transparent to load circuits utilizing said clock signals, comprising continuously keeping corresponding output clock signals in said CDU and said redundant CDU, frequency and phase coherent, by generating each output clock signal from a reference signal using an adaptive PLL circuitry at each CDU, and preadjusting the phase of each output clock signal of said redundant CDU to the corresponding output clock signal of said CDU, said PLL circuitry having an active mode and a standby mode with different response characteristics; wherein the CDU has at least one frequency input, at least one clock signal output and a PLL circuitry for generating at least one output clock signal from an input frequency, said PLL circuitry being capable to operate with slower or faster response time in response to a corresponding control signal and to shift the phase of at least one generated output clock signal according to a corresponding input signal, said CDU being capable to operate in active or standby mode, in response to a corresponding control signal.

11. A method for clock signals distribution having continuous switching capability between the outputs of a Clock Distribution Unit (CDU) and of a redundant CDU, said switching capability being transparent to load circuits utilizing said clock signals, comprising continuously keeping corresponding output clock signals in said CDU and said redundant CDU, frequency and phase coherent, by generating each output clock signal from a reference signal using an adaptive PLL circuitry at each CDU, and preadjusting the phase of each output clock signal of said redundant CDU to the corresponding output clock signal of said CDU, said PLL circuitry having an active mode and a standby mode with different response characteristics; wherein the redundant CDU has at least one frequency input, at least one clock signal output and a PLL circuitry for generating at least one output clock signal from an input frequency, said PLL circuitry being capable to operate with slower or faster response time in response to a corresponding control signal and to shift the phase of at least one generated output clock signal according to a corresponding input signal, said redundant CDU being capable to operate in active or standby mode, in response to a corresponding control signal.

12. A method for clock signals distribution having continuous switching capability between the outputs of a Clock Distribution Unit (CDU) and of a redundant CDU, said switching capability being transparent to load circuits utilizing said clock signals, comprising continuously keeping corresponding output clock signals in said CDU and said redundant CDU, frequency and phase coherent, by generating each output clock signal from a reference signal using an adaptive PLL circuitry at each CDU, and preadjusting the phase of each output clock signal of said redundant CDU to the corresponding output clock signal of said CDU, said PLL circuitry having an active mode and a standby mode with different response characteristics; wherein the switching capability is provided by at least one selection circuitry having at least two inputs and at least one output, one input of said selection circuitry being connected to an output of said CDU, another input of said selection circuitry being connected to an output of said redundant CDU, said selection circuitry being capable to select one of its inputs and transfer said selected input to its output, which is connected to a load circuit in response to a corresponding control signal.

13. A method for clock signals distribution having continuous switching capability between the outputs of a Clock Distribution Unit (CDU) and of a redundant CDU, said switching capability being transparent to load circuits utilizing said clock signals, comprising continuously keeping corresponding output clock signals in said CDU and said redundant CDU, frequency and phase coherent, by generating each output clock signal from a reference signal using an adaptive PLL circuitry at each CDU, and preadjusting the phase of each output clock signal of said redundant CDU to the corresponding output clock signal of said CDU, said PLL circuitry having an active mode and a standby mode with different response characteristics; further comprising the step of providing a control circuit connected to each CDU, and to a selection circuitry, said control circuit being suitable to switch between the CDU and the redundant CDU.

14. A method according to claim 11, wherein clock signal distribution is continued after the detection of failure in the CDU by switching to the output of the redundant CDU immediately after failure detection.

15. A method according to claim 12, wherein clock signal distribution is continued after the detection of failure in the CDU by switching to the output of the redundant CDU immediately after failure detection.

16. A method according to claim 13, wherein clock signal distribution is continued after the detection of failure in the CDU by switching to the output of the redundant CDU immediately after failure detection.

17. A method according to claim 11, wherein the reference signal to each frequency input of the CDU and the redundant CDU is provided by an input reference clock.

18. A method according to claim 12, wherein the reference signal to each frequency input of the CDU and the redundant CDU is provided by an input reference clock.

19. A method according to claim 12, wherein the reference signal to each frequency input of the CDU and the redundant CDU is provided by an input reference clock.

20. A method according to claim 11, wherein the PLL circuitry and each CDU module is a digital PLL.

21. A method according to claim 12, wherein the PLL circuitry and each CDU module is a digital PLL.

22. A method according to claim 13 wherein the PLL circuitry and each CDU module is a digital PLL.

23. A method for clock signal distribution having continuous switching capability between the outputs of a Clock Distribution Unit (CDU) and of a redundancy CDU, said switching capability being transparent to load circuits utilizing said clock signal, comprising;
   a.) providing an adaptive PLL circuitry in each CDU, said adaptive PLL circuitry operating in;
      I.) an active mode, characterized in a lower cut-off frequency, and slower response time, or
      II.) a standby mode, characterized in a higher cut-off frequency, and faster response time;
   b.) operating said CDU in said active mode, inputting an external input reference signal into said CDU and generating a first output clock signal that is locked by said PLL of the CDU to said external input reference signal;

c.) operating said redundancy CDU in said standby mode, inputting said first output clock signal into said redundant CDU and generating a second output clock signal that is locked by said PLL of the redundant CDU to said first output clock signal;

d.) generating an output clock signal, using the first output clock signal while continuously keeping said first and second output clock signals in said CDU and said redundant CDU, frequency and phase coherent; and e.) whenever desired, concurrently switching over between said first and second output clock signals and between the operating modes of said CDU and said redundant CDU and inputting said external input reference signal into said redundant CDU, thereby replacing said first output clock signal by said second output clock signal without phase error.

24. A method according to claim 10, wherein clock signal distribution is continued after the detection of failure in the CDU by switching to the output of the redundant CDU immediately after failure detection.

25. A method according to claim 10, wherein the reference signal to each frequency input of the CDU and the redundant CDU is provided by an input reference clock.

26. A method according to claim 11, further comprising the steps of:

a) providing at least two adjustable delay lines for delaying at least two incoming output clock signals;

b) generating a delayed signal path from at least one clock signal output of the CDU module into the redundant CDU module and another delayed signal path from at least one clock signal output of said redundant CDU module into said CDU module, using said delay lines;

c) determining an active operation mode for said CDU module and a standby operation mode for said redundant CDU module;

d) simultaneously:

d.1) controlling said first CDU module to operate in its active mode, said PLL of said first CDU module to operate in its slower response time, to lock on said input reference clock signal and generate at least one output clock signal from said input reference clock signal, and said at least one selection circuitry to select the corresponding input, being connected to said first CDU module, and transfer said selected input to the output of said selection switch;

d.2) controlling said redundant CDU module to operate in its standby mode, said PLL of said redundant first CDU module to operate in its faster response time, to lock on a clock signal generated in, and arriving from, said first CDU module, via said delayed signal path, and generate at least one output clock signal, from said delayed clock signal arriving from said first CDU module, and said at least one selection circuitry to select the corresponding input, being connected to said redundant CDU module, and block said selected input from arriving to the output of said selection switch; and e) adjusting the delay of the delay line to obtain phase coherence between said at least one output clock signal in said redundant CDU module, and at least one output clock signal in said first CDU module, having the same frequency.

27. A method according to claim 26, further comprising adjusting the phase of at least another output clock signal to obtain phase coherence between said at least another output clock signal in said redundant CDU module, and at least another output clock signal in said first CDU module, having the same frequency, by adding or subtracting an input signal to the phase error signal, generated in the PLL circuitry of s aid redundant CDU module.

28. A method according to claim 26, where in the redundant CDU module becomes active and being connected to the output of the selection circuitry whenever a failure is detected in the first CDU module.

29. A method according to claim 10, wherein the PLL circuitry in each CDU is a digital PLL.

* * * * *